US008283561B2

(12) United States Patent
Serban et al.

(10) Patent No.: US 8,283,561 B2
(45) Date of Patent: Oct. 9, 2012

(54) QUANTUM DOT SOLAR CELL

(75) Inventors: Bogdan Serban, Bucharest (RO); Mihai N. Mihaila, Bucharest (RO); Stefan Dan Costea, Bucharest (RO); Viorel Georgel Dumitru, Prahova (RO)

(73) Assignee: Honeywell International Inc., Morristown, NJ (US)

( * ) Notice: Subject to any disclaimer, the term of this patent is extended or adjusted under 35 U.S.C. 154(b) by 448 days.

(21) Appl. No.: 12/412,220

(22) Filed: Mar. 26, 2009

(65) Prior Publication Data

US 2009/0283142 A1 Nov. 19, 2009

Related U.S. Application Data

(60) Provisional application No. 61/052,748, filed on May 13, 2008.

(51) Int. Cl.
*H01L 31/00* (2006.01)
*H01L 35/12* (2006.01)
*H01L 35/00* (2006.01)
*H01B 1/00* (2006.01)

(52) U.S. Cl. ........ 136/263; 136/206; 136/238; 136/252; 136/256; 252/500

(58) Field of Classification Search .................. 365/151; 136/263, 256, 252, 291, 238, 206; 252/500
See application file for complete search history.

(56) References Cited

U.S. PATENT DOCUMENTS

| 4,927,721 | A | 5/1990 | Gratzel et al. |
|---|---|---|---|
| 5,677,545 | A | 10/1997 | Shi et al. |
| 6,566,595 | B2 | 5/2003 | Suzuki |
| 6,919,119 | B2 | 7/2005 | Kalkan et al. |
| 7,042,029 | B2 | 5/2006 | Graetzel et al. |
| 7,202,412 | B2 | 4/2007 | Yamanaka et al. |
| 7,202,943 | B2 | 4/2007 | Chang et al. |
| 7,268,363 | B2 | 9/2007 | Lenhard et al. |
| 7,462,774 | B2 | 12/2008 | Roscheisen et al. |
| 7,563,507 | B2 | 7/2009 | Emrick et al. |
| 7,655,860 | B2 | 2/2010 | Parsons |
| 2004/0025139 | A1* | 2/2004 | Kobayashi ........................ 716/19 |
| 2005/0028862 | A1 | 2/2005 | Miteva et al. |
| 2006/0021647 | A1 | 2/2006 | Gui et al. |
| 2006/0169971 | A1 | 8/2006 | Cho et al. |
| 2006/0263908 | A1 | 11/2006 | Hirai |
| 2007/0025139 | A1 | 2/2007 | Parsons |
| 2007/0028959 | A1 | 2/2007 | Lee et al. |
| 2007/0062576 | A1 | 3/2007 | Duerr et al. |
| 2007/0119048 | A1 | 5/2007 | Li et al. |
| 2007/0120177 | A1 | 5/2007 | McGregor et al. |
| 2007/0122927 | A1 | 5/2007 | Li et al. |
| 2007/0123690 | A1 | 5/2007 | Parham et al. |
| 2007/0243718 | A1 | 10/2007 | Shiratori et al. |
| 2008/0110494 | A1 | 5/2008 | Reddy |
| 2008/0264479 | A1 | 10/2008 | Harris et al. |
| 2009/0114273 | A1 | 5/2009 | Kamat |
| 2009/0159120 | A1 | 6/2009 | Wang et al. |
| 2009/0159124 | A1 | 6/2009 | Mihaila et al. |
| 2009/0159131 | A1 | 6/2009 | Zheng et al. |
| 2009/0159999 | A1 | 6/2009 | Zheng et al. |
| 2009/0211634 | A1 | 8/2009 | Serban et al. |
| 2009/0260682 | A1 | 10/2009 | Serban et al. |
| 2009/0260683 | A1 | 10/2009 | Serban et al. |
| 2010/0006148 | A1 | 1/2010 | Zheng et al. |
| 2010/0012168 | A1 | 1/2010 | Mihaila et al. |
| 2010/0012191 | A1 | 1/2010 | Serban et al. |
| 2010/0043874 | A1 | 2/2010 | Liu |
| 2010/0116326 | A1 | 5/2010 | Gur et al. |
| 2010/0193025 | A1 | 8/2010 | Serban et al. |
| 2010/0193026 | A1 | 8/2010 | Serban et al. |
| 2010/0326499 | A1 | 12/2010 | Liu |

FOREIGN PATENT DOCUMENTS

| EP | 1473745 | * | 3/2004 |
|---|---|---|---|
| EP | 1473745 | | 11/2004 |
| EP | 1689018 | | 8/2006 |
| EP | 1936644 | | 6/2008 |
| JP | 2008177099 | | 7/2008 |
| WO | WO 2004/017345 | | 2/2004 |
| WO | WO 2006/099386 | | 9/2006 |
| WO | WO 2006/119305 | | 11/2006 |
| WO | WO 2007/098378 | | 8/2007 |
| WO | WO 2007/100600 | | 9/2007 |

OTHER PUBLICATIONS

Diguna et al., "High Efficiency of CdSe Quantum-Dot-Sensitized TiO2 Inverse Opal Solar Cells," Applied Physics Letters, vol. 91, No. 023116, 3 pages, 2007.
Chang et al., "Chemical Bath Deposition of CdS Quantum Dots Onto Mesoscopic $TiO_2$ Films for Application in Quantum-Dot-Sensitized Solar Cells," Applied Physics Letters, vol. 91, 3 pages, 2007.
U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/484,034, filed Jun. 12, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.
Hodes, "Chemical Solution Deposition of Semiconductor Films," Marcel Dekker Inc., 381 pages, 2002.
Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.
Afzal, "Studies of Cephradine Metal Interactions," 342 pages, Oct. 1998.

(Continued)

*Primary Examiner* — Ling Choi
*Assistant Examiner* — Monique Peets
(74) *Attorney, Agent, or Firm* — Seager Tufte & Wickhem LLC.

(57) ABSTRACT

A solar cell including a quantum dot and an electron conductor, and a bifunctional ligand disposed between the quantum dot and the electron conductor. The bifunctional ligand molecule may include an electron conductor anchor that bonds to the electron conductor and a first quantum dot anchor that bonds to the quantum dot. A hole conductor such as a conductive polymer may include a second quantum dot anchor.

5 Claims, 2 Drawing Sheets

OTHER PUBLICATIONS

Anacona et al., "Synthesis and Antibacterial Activity of Cefotaxime Metal Complexes," Journal of the Chilean Chemical Society, vol. 50, No. 2, 7 pages, Jun. 2005.
Anacona et al., "Synthesis and Antibacterial Activity of Cefoxitin Metal Complexes," Transition Metal Chemistry, vol. 30, pp. 605-609, 2005.
Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.
Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.
Diol et al., "Electron Transfer Dynamics at GaAs Surface Quantum Wells," Journal of Physical Chemistry B, vol. 102, pp. 6193-6201, 1998.
El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.
Enescu, Medicamente, pp. 292-293, 2005.
Enright et al., "Spectroscopic Determination of Electron and Hole Effective Masses in a Nanocrystalline Semiconductor Film," Journal of Physical Chemistry vol. 100, No. 3, pp. 1027-1035, 1996.
Galoppini, "Linkers for Anchoring Sesitizers to Semiconductor Nanoparticles," Coordination Chemistry Reviews vol. 248, pp. 1283-1297, 2004.
Gautam et al., "Soft Chemical Routes to Semiconductor Nanostructures," Pramana Journal of Physics, vol. 65, No. 4, pp. 549-564, Oct. 2005.
Gregg, "Excitonic Solar Cells," Journal of Physical Chemistry B., vol. 107, pp. 4688-4698, No. 20, May 1, 2003.
Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.
http://en.wikipedia.org/wiki/Quantum_dot_solar_cell, "Nanocrystal Solar Cell," 1 page, printed Oct. 17, 2007.
http://findarticles.com/articles/mi_qa3776/is_200605ai_n17176721/print, "Ultradense GaN Nanopillar and Nanopore Arrays by Self-Assembly Nanopatterning," 4 pages, May 5, 2008.
http://www.evidenttech.com, Evident Technologies Webpages, 11 pages, printed Oct. 17, 2007.
http://www.i-sis.org.uk/QDAUESC.php, "Quantum Dots and Ultra-Efficient Solar Cells?" ISIS Press Release, Jan. 19, 2006.
Hwang et al., "A Highly Efficient Organic Sensitizer for Dye-Sensitized Solar Cells," Chemical Communications, 5 pages, printed Sep. 27, 2007.
ISBN No. 7-04-009141-0, 8 pages, 2001, 2003.
ISBN No. 978-7-03-015873-4, 8 pages, 2005.
Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.
Kim et al., "Enhanced Photocatalytic Activity in Composites of $TiO_2$ Nanotubes and Cds Nanoparticles," Chem. Commun., pp. 5024-5026, 2006.
Klimov, "Spectral and Dynamical Properties of Multiexcitons in Semiconductor Nanocrystals," ANRV, vol. 308-PC58-24, pp. 635-673, Dec. 2, 2006.
Kouklin et al., "Ultradense GaN Nanopillar and Nanopore Arrays by Self-Assembly and Nanopatterning," Journal of Electronic Materials, vol. 35, No. 5, pp. 1133-1137, May 2006.
Kuzyk, "Erratum: Physical Limits on Electronic Nonlinear Molecular Susceptibilities," Physical Review Letters, vol. 90, No. 3, 1 page, Jan. 2003.
Kuzyk, "Fundamental Limits on Third-Order Molecular Susceptibilities," Optics Letters, vol. 25, No. 16, pp. 1183-1185, Aug. 15, 2000.
Kuzyk, "Physical Limits on Electronic Nonlinear Molecular Susceptibilities," Physical Review Letters, vol. 85, No. 6, pp. 1218-1221, Aug. 7, 2000.
Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.
Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.
Li et al., "Band-Structure-Corrected Local Density Approximation Study of Semiconductor Quantum Dots and Wires," Physical Review B., vol. 72, 15 pages, 2005.
Li et al., "Conducting Polythiophenes with a Broad Spectrum of Reactive Groups," Journal of Polymer Science A, Polymer Chemistry, vol. 43, pp. 4547-4558, 2005.
Li et al., "Review of Recent Progress in Solid-State Dye-Sensitized Solar Cells," Solar Energy Materials and Solar Cells, vol. 90, pp. 549-573, 2006.
Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.
Marcus et al, "Electron Transfers in Chemistry and Biology," Biochimica et Biophysica Acta, vol. 811, pp. 265-322, 1985.
Marcus et al., "Electron Transfer Reactions in Chemistry, Theory and Experiment," Reviews of Modern Physics, vol. 65, No. 3, pp. 599-610, Jul. 1993.
Marcus, "Electrostatic Free Energy and Other Properties of States Having Nonequilibrium Polarization. I," The Journal of Chemical Physics, vol. 24, No. 5, 11 pages, May 1956.
Marcus, "On the Theory of Oxidation-Reduction Reactions Involving Electron Transfer. I," The Journal of Chemical Physics, vol. 24, No. 5, 13 pages, May 1956.
Meier et al., "Fast Electron Transfer Across Semiconductor-Molecule Interfaces: GaAs/Co(Cp)$_2$," Journal of Physical Chemistry B., vol. 103, pp. 2122-2141, 1999.
Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.
Morrison et al., Organic Chemistry, Sixth Edition, Chapter 6, pp. 240-242, 1992.
Neale et al., "Effect of a Coadsorbent on the Performance of Dye-Sensitized $TiO_2$ Solar Cells: Shielding Versus Band-Edge Movement," Journal of Physical Chemistry B., vol. 109, No. 49, pp. 23183-23189, 2005.
Nenitescu, Chimie Organica, vol. I, p. 522, 1980.
Nenitescu, Chimie Organica, vol. II, p. 581, 1980.
Nilsing et al., "Phosphonic Acid Adsorption at the $TiO_2$ Anatase (101) Surface Investigated by Periodic Hybrid HF-DFT Computations," Surface Science, vol. 582, pp. 49-60, 2005.
Nozick et al., "Quantum Dot Solar Cells," Physica E, vol. 14, pp. 115-120, 2002.
O'Reagan et al., "A Low-Cost, High Efficiency Solar Cell Based on Dye-Sensitized Colloidal $TiO_2$ Films," Nature, vol. 353, pp. 737-740, Oct. 24, 1991.
Oyaizu et al., "Linear Ladder-Type Conjugated Polymers Composed of Fused Thiophene Ring Systems," Macromolecules, vol. 37, No. 4, pp. 1257-1270, 2004.
Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.
Perez-Moreno et al., "Modulated Conjugation as a Means for Attaining a Record High Intrinsic Hyperpolarizability," Optics Letters, vol. 32, No. 1, pp. 59-61, Jan. 1, 2007.
Pomerantz et al., "Synthesis and Properties of Poly[3-(w-bromoalkyl)thiophene]," Synthetic Metals, vol. 101, 1 page, 1999.
Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.
Qian et al., "Gallium Nitride-Based Nanowire Radial Heterostructures for Nanophotonics," NanoLetters, vol. 4, No. 10, pp. 1975-1979, 2004.

Qiu et al., "Fabrication of TiO$_2$ Nanotube Film by Well-Aligned ZnO Nanorod Array Film and Sol-Gel Process," Thin Solid Films, vol. 515, pp. 2897-2902, 2007.

Robel et al., "Quantum Dot Solar Cells, Harvesting Light Energy with CdSe Nanocrystals Molecularly Linked to Mesoscopic TiO$_2$ Films," Journal of the American Chemical Society, vol. 128, No. 7, pp. 2385-2393, 2006.

Robel et al., "Size-Dependent Electron Injection from Excited CdSeQuantum Dots into TiO$_2$ Nanoparticles," JACS Communications, 2 pages, Mar. 21, 2007.

Wang et al. "Enhance the Performance of Dye-Sensitized Solar Cells by Co-grafting Amphiphilic Sensitizer and Hexadecylmalonic Acid on TiO$_2$ Nanocrystals," Journal of Physical Chemistry B., vol. 107, No. 51, pp. 14336-14341, 2003.

Wu et al., "Superior Radiation Resistance of In$_{1-x}$Ga$_x$N Alloys: Full-Solar-Spectrum Photovoltaic Material System," Journal of Applied Physics, vol. 24, No. 10, pp. 6477-6482, Nov. 15, 2003.

Xu et al., "New Triphenylamine-Based Dyes for Dye-Sensitized Solar Cells," Journal of Physical Chemistry C, vol. 112, No. 3, pp. 874-880, 2008.

Yum et al., "Efficient Co-Sensitization of Nanocrystalline TiO$_2$ Films by Organic Sensitizers," Chemical Communications, 7 pages, printed Sep. 27, 2007.

Dennler et al., "Polymer-Fullerene Bulk-Heterojunction Solar Cells," Advanced Materials, vol. 21, pp. 1323-1338, 2009.

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

Banerjee et al., "Synthesis and Characterization of Carbon Nanotube-Nanocrystal Heterostructures," Nano Letters, vol. 2, No. 3, pp. 195-200, 2002.

Clarke et al., "Photophysics of Dopamine-Modified Quantum Dots and Effects on Biological Systems," Nature Materials, vol. 5, pp. 409-417, May 2006.

Gebeyehu et al., "Hybrid Solar Cells Based on Dye-Sensitized Nanoporous TiO$_2$ Electrodes and Conjugated Polymers as Hole Transport Materials," Synthetic Metals, vol. 125, pp. 279-287, 2002.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.

Landes et al., "On the Nanoparticle to Molecular Size Transition: Flourescence Quenching Studies," vol. 105, No. 43, pp. 10554-10558, 2001.

Law et al., "ZnO-Al$_2$O$_3$ and ZnO-TiO$_2$ Core-Shell Nanowire Dye-Sensitized Solar Cells," Journal Phys. Chemistry B, vol. 110, No. 45, pp. 22652-22663, 2006.

Leschkies et al., "Photosensitization of ZnO Nanowires with CdSe Quantum Dots for Photovoltaic Devices," Nano Letters, vol. 7, No. 6, pp. 1793-1798, 2007.

Ma et al., "A Sensitive Method for the Detection of Catecholamine Based on Fourescence Quenching of CdSe Nanocrystals," Talanta, vol. 67, pp. 979-983, 2005.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Plass et al., "Quantum Dot Sensitization of Organic-Inorganic Hybrid Solar Cells," Journal Phys. Chemistry B, vol. 106, No. 31, pp. 7578-7580, 2002.

Quintana et al., "Comparison of Dye-Sensitized ZnO and TiO$_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).

Sharma et al., "Photoinduced Charge Transfer Between CdSe Quantum Dots and p-Phenylenediamine," Journal Phys. Chemistry B, vol. 107, No. 37, pp. 10088-10093, 2003.

Snaith et al., "Self-Organization of Nanocrystals in Polymer Brushes. Application in Heterojunction Photovoltaic Diodes," Nano Letters, vol. 5, No. 9, pp. 1653-1657, 2005.

Wu et al., "Phosphate-Modified TiO$_2$ Nanoparticles for Selective Detection of Dopamine, Levodopa, Adrenaline, and Catechol Based on Flourescence Quenching," Langmuir, vol. 23, No. 14, pp. 7880-7885, 2007.

Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).

* cited by examiner

QUANTUM DOT SOLAR CELL

PRIORITY

This application claims priority under 35 U.S.C. §119 to U.S. Provisional Application Ser. No. 61/052,748 entitled "QUANTUM DOT SOLAR CELL" filed May 13, 2008, the entirety of which is incorporated herein by reference.

TECHNICAL FIELD

The disclosure pertains generally to solar cells and more particularly to quantum dot solar cells.

SUMMARY

The disclosure pertains generally to solar cells. In some instances, a solar cell may include quantum dots as light sensitizers. In an illustrative but non-limiting example, the disclosure pertains to a solar cell that includes an electron conductor layer, a quantum dot layer and a bifunctional ligand layer that couples the electron conductor layer and the quantum dot layer. A hole conductor layer is also coupled to the quantum dot layer. In some instances, the bifunctional ligand layer may include one or more of

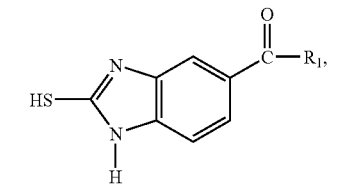

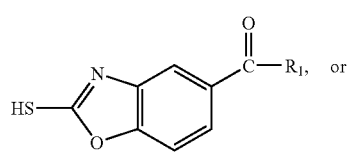

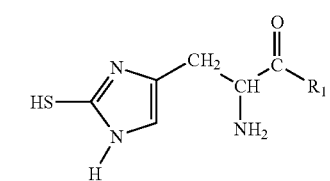

where $R_1$ is hydroxyl, alkoxy, halogen or $NR_2$, with $R_2$ being alkyl.

In another illustrative but non-limiting example, the disclosure pertains to a solar cell that includes an electron conductor layer, a quantum dot layer and a bifunctional ligand layer that couples the electron conductor layer and the quantum dot layer. A hole conductor layer is also coupled to the quantum dot layer. In some instances, the bifunctional ligand layer may include one or more of

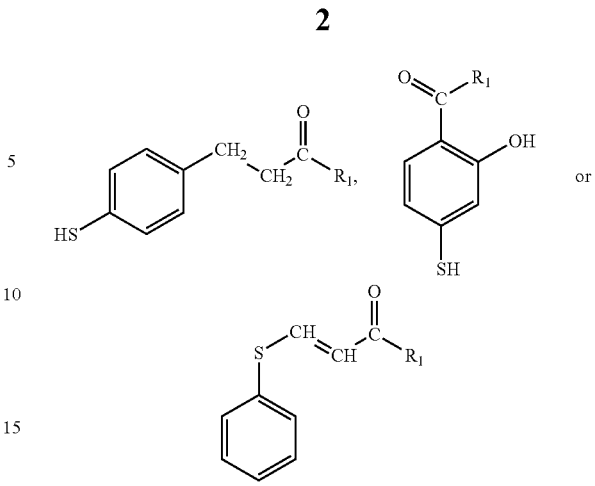

where $R_1$ is as defined above.

In another illustrative but non-limiting example, the disclosure pertains to a solar cell that includes an electron conductor layer, a quantum dot layer and a bifunctional ligand layer that couples the electron conductor layer and the quantum dot layer. A hole conductor layer is also coupled to the quantum dot layer. In some instances, the bifunctional ligand layer may include one or more of

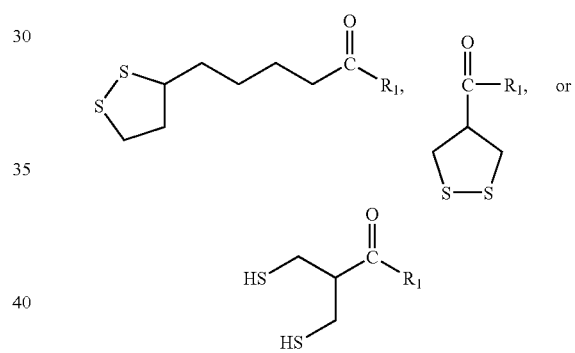

where $R_1$ is as defined above.

In another illustrative but non-limiting example, the disclosure pertains to a solar cell that includes an electron conductor layer, a quantum dot layer and a bifunctional ligand layer that couples the electron conductor layer and the quantum dot layer. A hole conductor layer is also coupled to the quantum dot layer. In some instances, the bifunctional ligand layer may include one or more of

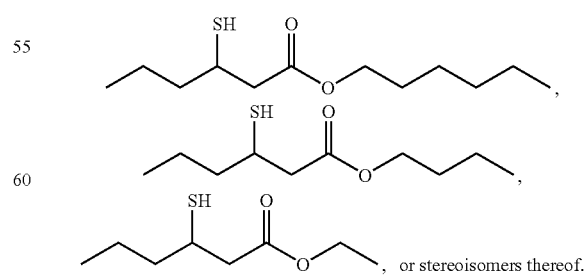

, or stereoisomers thereof.

The above summary is not intended to describe each disclosed embodiment or every implementation of the disclosure. The Detailed Description which follow more particularly exemplify these embodiments.

BRIEF DESCRIPTION OF THE FIGURES

The following description should be read with reference to the drawings. The drawings, which are not necessarily to scale, depict selected embodiments and are not intended to limit the scope of the disclosure. The disclosure may be more completely understood in consideration of the following detailed description of various embodiments in connection with the accompanying drawings, in which.

Figure 1:
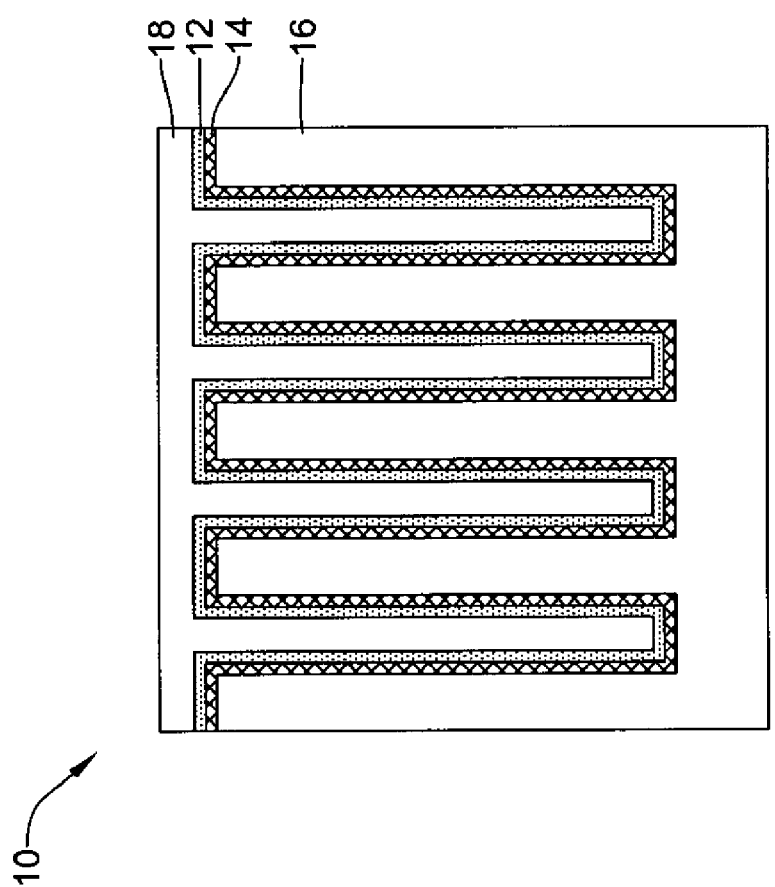
FIG. 1 is a schematic cross-sectional side view of an illustrative but non-limiting example of a solar cell.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

The term "alkyl" refers to a straight or branched chain monovalent hydrocarbon radical having a specified number of carbon atoms. Examples of "alkyl" include, but are not limited to, methyl, ethyl, n-propyl, isopropyl, n-butyl, s-butyl, t-butyl, n-pentyl, n-hexyl, 3-methylpentyl, and the like.

The term "hydroxyl" as used herein refers to an —OH group. The term "halogen" as used herein refers to atoms found in Group VIIA of the periodic table, such as fluorine, chlorine, bromine and iodine.

The term "alkoxy" refers to a moiety that combines an oxygen atom with an alkyl group. In some instances, the oxygen molecule may bond to a molecule while the alkyl group is pendant. An example of an alkoxy is ethoxy, which is of the formula —$OCH_2CH_3$.

FIG. 1 is a schematic cross-sectional side view of an illustrative solar cell 10. In the illustrative example shown in FIG. 1, there may be a three-dimensional intermingling or interpenetration of the layers forming solar cell 10, but this is not required. The illustrative solar cell 10 includes a quantum dot layer 12. Quantum dot layer 12 may schematically represent a single quantum dot. In some cases, quantum dot layer 12 may be considered as representing a large number of individual quantum dots.

In the illustrative embodiment of FIG. 1, a bifunctional ligand layer 14 is provided, and may schematically represent a single bifunctional ligand, such as those discussed below. In some cases, bifunctional ligand layer 14 may represent a large number of individual bifunctional ligands, with at least some of the bifunctional ligands within bifunctional ligand layer 14 bonded to corresponding quantum dots within quantum dot layer 12. The illustrative solar cell 10 of FIG. 1 also includes an electron conductor layer 16. In some cases, electron conductor layer 16 may be an n-type conductor as discussed below. The illustrative solar cell 10 may further include a hole conductor layer 18. As discussed below, hole conductor layer 18 may be a p-type conducting electrode layer.

Bifunctional ligand layer 14 may, in some instances, be considered as being coupled to quantum dot layer 12 as well as being coupled to electron conductor layer 16. Similarly, hole conductor layer 18 may also be considered as being coupled to quantum dot layer 12. In some cases, two layers may be considered as being coupled if one or more molecules or other moieties within one layer are bonded or otherwise secured to one or more molecules within another layer. In some instances, coupling infers the potential passage of electrons from one layer to the next.

Quantum dot layer 12 may include one quantum dot or a plurality of quantum dots. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups II-VI, III-V, or IV-VI materials. The quantum dots employed herein may be formed using any appropriate technique. Examples of specific pairs of materials for forming quantum dots include, but are not limited to, MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb.

Figure 2:
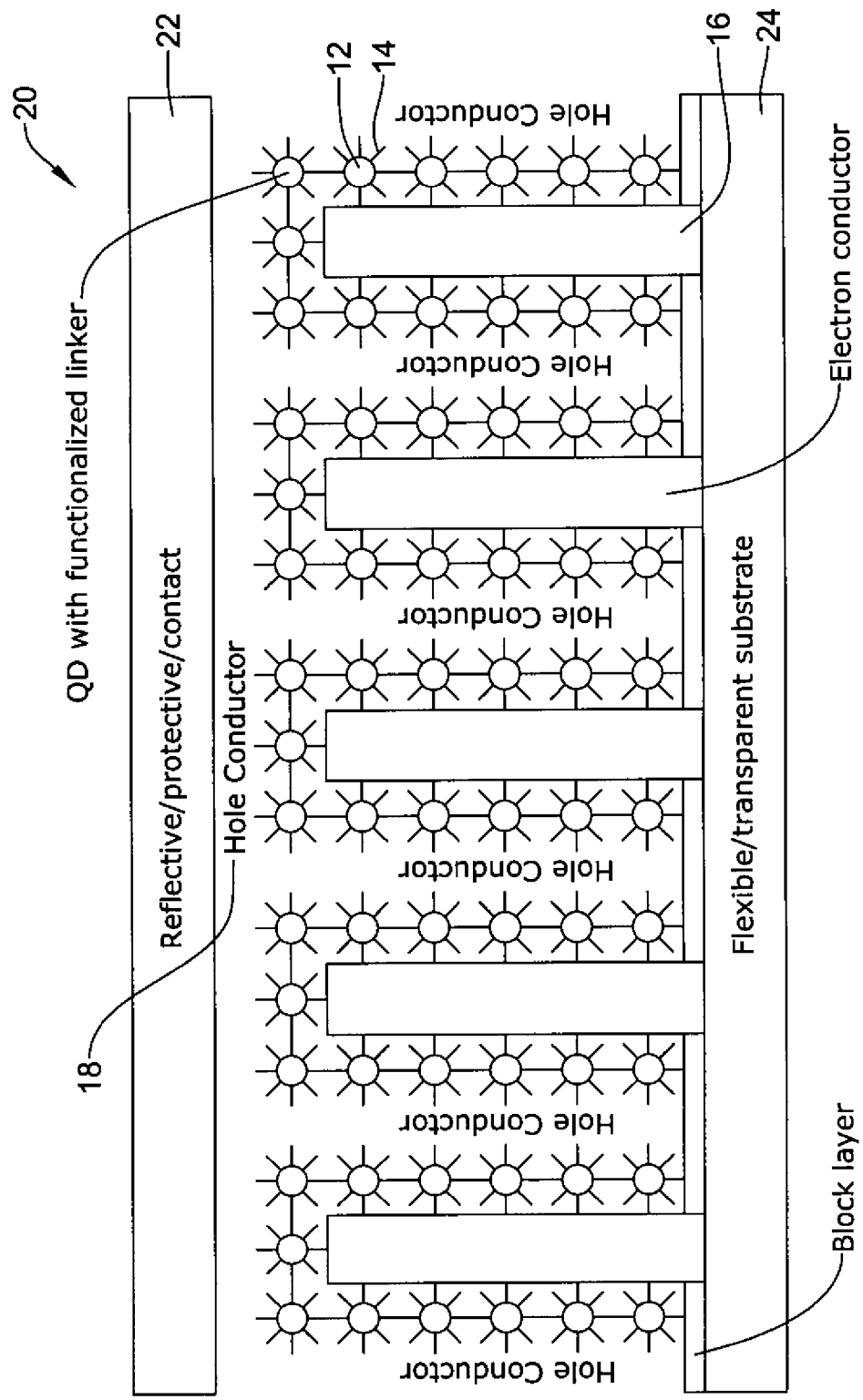
FIG. 2 is a schematic cross-sectional side view of another illustrative but non-limiting example of a solar cell.

FIG. 2 is a schematic cross-sectional side view of an illustrative solar cell 20 that is similar to solar cell 10 (FIG. 1). In some cases, a reflective and/or protecting layer 22 may be disposed over the hole conductor layer 18, as shown. The reflective and/or protecting layer 22 may be a conductive layer. In some instances, the reflective and/or protecting layer 22 may include a Pt/Au/C film as both catalyst and conductor, but this is not required. Alternatively, or in addition, a flexible and transparent substrate 24, shown at the lower side (in the illustrated orientation) of FIG. 2, may be an electron conductor such as an n-type electron conductor. The n-type electron conductor may be transparent or at least substantially transparent to at least some wavelengths of light within the visible portion of the electromagnetic spectrum.

As described with respect to FIG. 1, solar cell 10 may include a bifunctional ligand layer 14. In some cases, bifunctional ligand layer 14 may include a single bifunctional ligand or a large number of bifunctional ligands. A bifunctional ligand may, in some cases, be considered as improving electron transfer by reducing the energy barriers for electron transfer. A bifunctional ligand may provide a conduit so that electrons that are ejected by the quantum dot can travel to and through the electron conductor. A bifunctional ligand may, for example, secure the quantum dot relative to the electron conductor and/or any other related structure.

In some instances, the electron conductor anchor may include a carboxylic acid moiety, an amide moiety, an ether or an acid halide. In some instances, a quantum dot anchor may be selected to bond well to a particular quantum dot. To illustrate, $Ag_2S$, CdSe, CdTe and CdS are examples of quantum dots that may be employed in the light sensitive assemblies discussed herein.

An illustrative but non-limiting example of a suitable bifunctional ligand has the following structure:

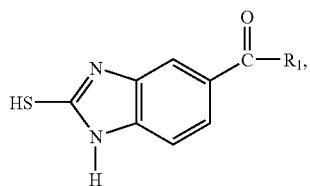

where $R_1$ is hydroxyl, alkoxy, halogen or $NR_2$, with $R_2$ being alkyl. Particular examples of bifunctional ligands of this structure include the following:

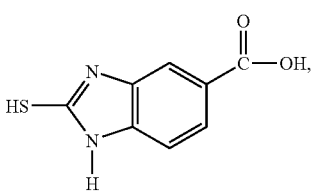

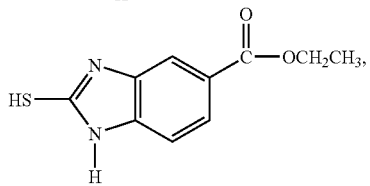

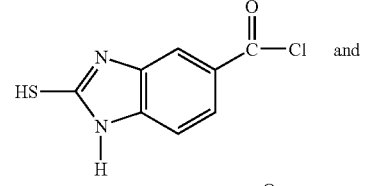

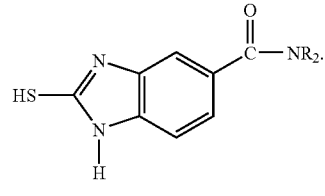

Another illustrative but non-limiting example of a suitable bifunctional ligand has the following structure:

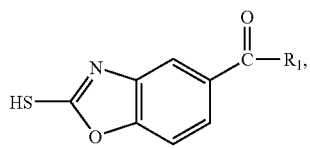

where $R_1$ is hydroxyl, alkoxy, halogen or $NR_2$, with $R_2$ being alkyl. Particular examples of bifunctional ligands of this structure include the following:

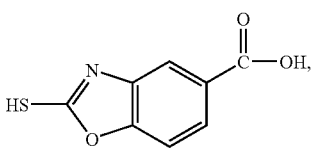

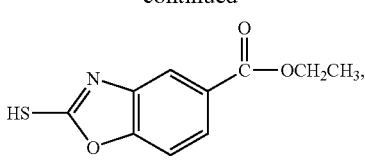

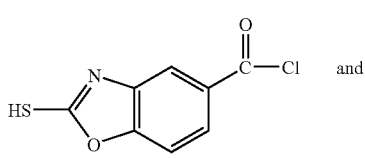

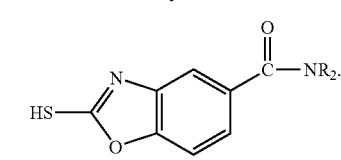

Another illustrative but non-limiting example of a suitable bifunctional ligand has the following structure:

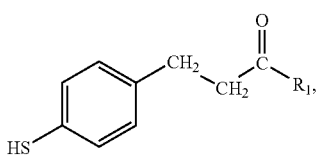

where $R_1$ is hydroxyl, alkoxy, halogen or $NR_2$, with $R_2$ being alkyl. Particular examples of bifunctional ligands of this structure include the following:

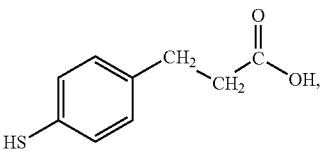

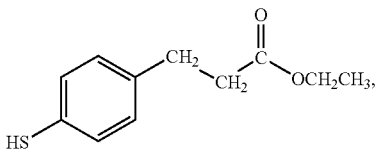

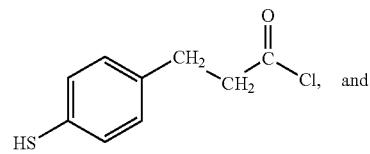

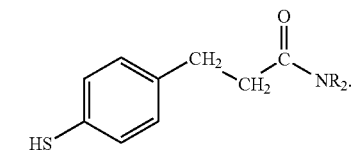

Another illustrative but non-limiting example of a suitable bifunctional ligand has the following structure:

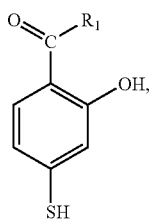

where $R_1$ is hydroxyl, alkoxy, halogen or $NR_2$, with $R_2$ being alkyl. Particular examples of bifunctional ligands of this structure include the following:

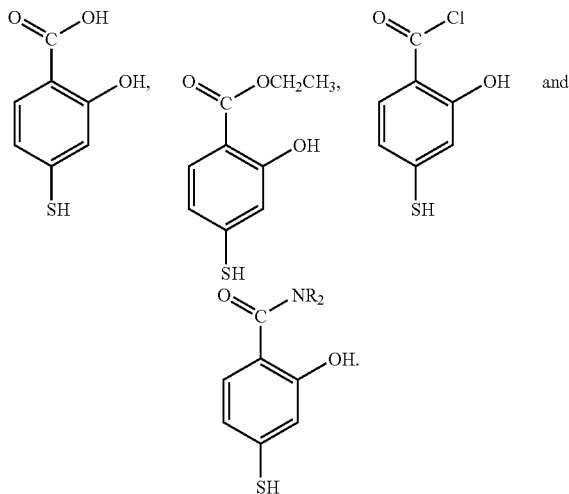

Another illustrative but non-limiting example of a suitable bifunctional ligand has the following structure:

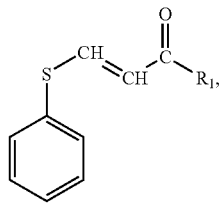

or a stereoisomer thereof, and where $R_1$ is hydroxyl, alkoxy, halogen or $NR_2$, with $R_2$ being alkyl. Particular examples of bifunctional ligands of this structure include the following:

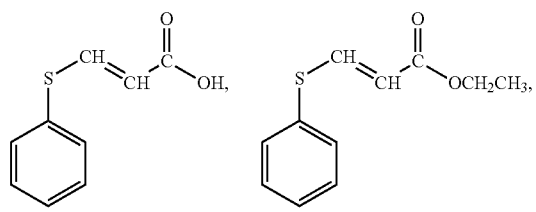

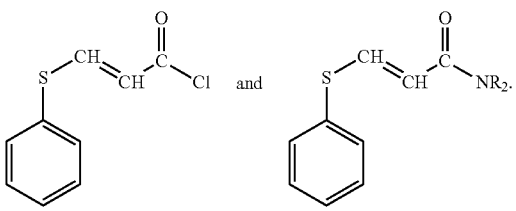

It will be recognized that at least some of the bifunctional ligands described herein include carbon-carbon double bonds and thus some of the molecules may be considered as being either Z (same side) isomers or E (opposite side) isomers. In some cases, a solar cell including a number of bifunctional ligands may include only stereospecific bifunctional ligands, i.e., all Z isomers or all E isomers, for example. In some instances, a solar cell including a number of bifunctional ligands may include one or more Z isomers and one or more E isomers.

Another illustrative but non-limiting example of a suitable bifunctional ligand has the following structure:

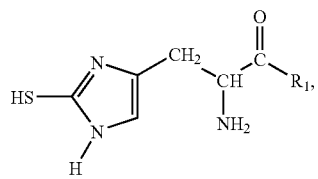

where $R_1$ is hydroxyl, alkoxy, halogen or $NR_2$, with $R_2$ being alkyl. Particular examples of bifunctional ligands of this structure include the following:

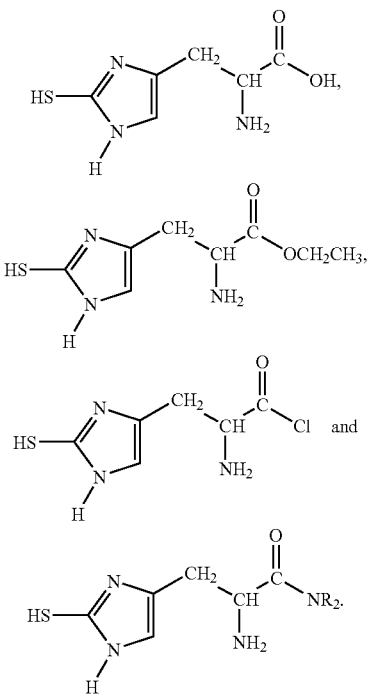

Another illustrative but non-limiting example of a suitable bifunctional ligand has the following structure:

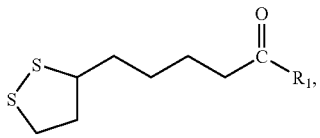

where $R_1$ is hydroxyl, alkoxy, halogen or $NR_2$, with $R_2$ being alkyl. Particular examples of bifunctional ligands of this structure include the following:

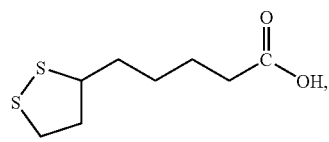

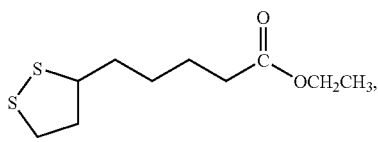

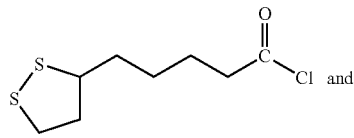

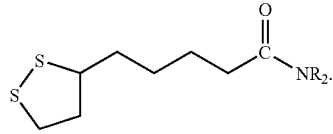

Another illustrative but non-limiting example of a suitable bifunctional ligand has the following structure:

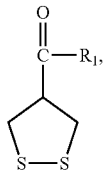

where $R_1$ is hydroxyl, alkoxy, halogen or $NR_2$, with $R_2$ being alkyl. Particular examples of bifunctional ligands of this structure include the following:

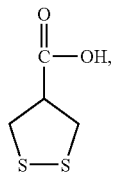 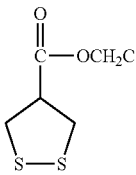 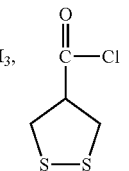 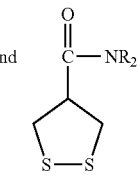

Another illustrative but non-limiting example of a suitable bifunctional ligand has the following structure:

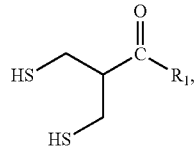

where $R_1$ is hydroxyl, alkoxy, halogen or $NR_2$, with $R_2$ being alkyl. Particular examples of bifunctional ligands of this structure include the following:

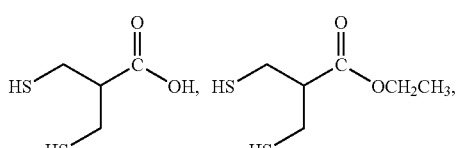

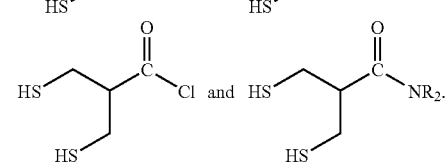
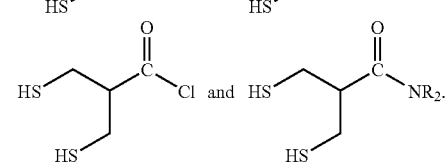
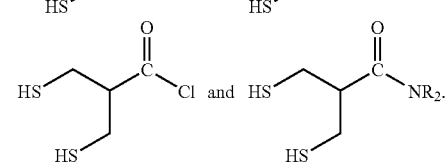

Another illustrative but non-limiting example of a suitable bifunctional ligand has the following structure:

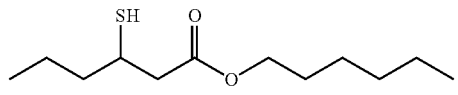

or a stereoisomer thereof.

Another illustrative but non-limiting example of a suitable bifunctional ligand has the following structure:

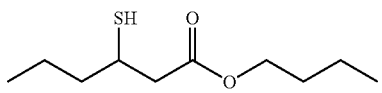

or a stereoisomer thereof.

Another illustrative but non-limiting example of a suitable bifunctional ligand has the following structure:

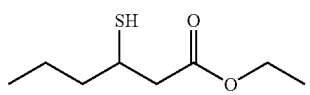

or a stereoisomer thereof.

In some cases, a light sensitive assembly or a solar cell may include one or a number of bifunctional ligands. In some instances, a solar cell may include a number of bifunctional ligands that are isomers having the same molecular formula. These isomers may, for example, be dextrorotatory molecules, levorotatory molecules or a racemic mixture thereof. In some cases, a light sensitive assembly or solar cell may include a large number of bifunctional ligands representing a plurality of chemically different bifunctional ligands. Each group or subset of bifunctional ligands, either separately or in combination, may be dextrorotatory, levorotatory or a racemic mixture thereof.

Referring back to FIG. 1, the illustrative solar cell 10 may include an electron conductor layer 16, which may be formed of any suitable material. In some cases, the electron conductor layer 16 may be an n-type electron conductor. The electron conductor layer 16 may be metallic, such as $TiO_2$ or ZnO. In some cases, electron conductor layer 16 may be an electrically conducting polymer, such as a polymer that has been doped to be electrically conducting or to improve its electrical conductivity.

As discussed with respect to FIG. 1, the illustrative solar cell 10 may include a hole conductor layer 18 that is configured to reduce a quantum dot once the quantum dot has absorbed a photon and ejected an electron through the bifunctional ligand to the electron cnductor. In some instances, the hole conductor may be a conductive polymer. In some cases, the conductive polymer may include a monomer that has an alkyl chain that terminates in a second quantum dot anchor. The conductive polymer may, for example, be or otherwise include a polythiophene that is functionalized with a moiety that bonds to quantum dots. In some cases, the polythiophene may be functionalized with a thio or thioether moiety.

An illustrative but non-limiting example of a suitable conductive polymer has

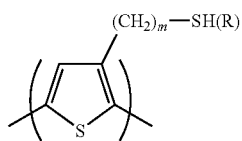

as a repeating unit, where R is absent or alkyl and m is an integer ranging from about 6 to about 12.

Another illustrative but non-limiting example of a suitable conductive polymer has

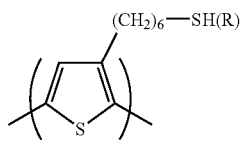

as a repeating unit, where R is absent or alkyl.

Another illustrative but non-limiting example of a suitable conductive polymer has

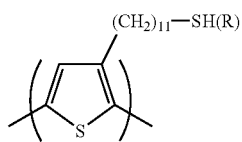

as a repeating unit, where R is absent or alkyl.

Another illustrative but non-limiting example of a suitable conductive polymer has

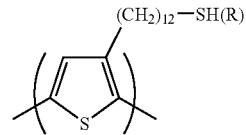

as a repeating unit, where R is absent or alkyl.

A solar cell may, for example, be assembled by growing nanoparticles of n-type semiconducting titanium dioxide on a glass substrate, optionally followed by a sintering process. Next, the quantum dots, the bifunctional ligands and the conducting polymer are synthesized. Finally, the solar cell may be assembled by combining the individual components in a one-pot synthesis.

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

We claim:
1. A solar cell comprising:
   an electron conductor layer;
   a quantum dot layer;
   a bifunctional ligand layer coupling the electron conductor layer and the quantum dot layer, the bifunctional ligand layer including one or more of:

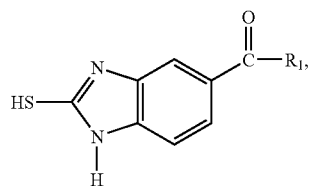

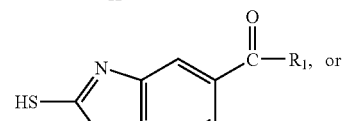

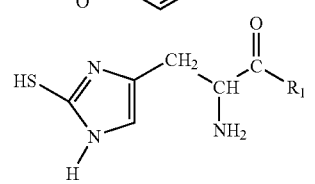

where $R_1$ is hydroxyl, alkoxy, halogen or $NR_2$, with $R_2$ being alkyl; and
a hole conductor layer coupled to the quantum dot layer.

2. A solar cell comprising:
   an electron conductor layer;
   a quantum dot layer;
   a bifunctional ligand layer coupling the electron conductor layer and the quantum dot layer;
   a hole conductor layer coupled to the quantum dot layer; and wherein the bifunctional ligand layer comprises one or more of:

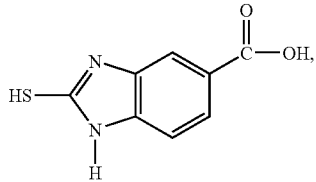

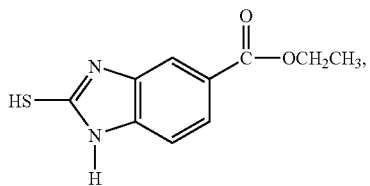

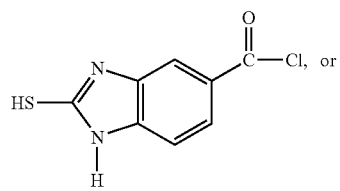

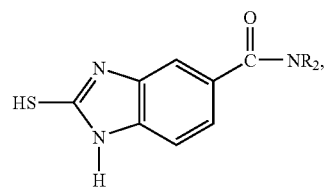

where $R_2$ is an alkyl moiety.

3. A solar cell comprising:
an electron conductor layer;
a quantum dot layer;
a bifunctional ligand layer coupling the electron conductor layer and the quantum dot layer;
a hole conductor layer coupled to the quantum dot layer; and
wherein the bifunctional ligand layer comprises one or more of:

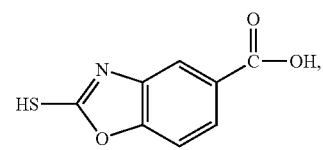

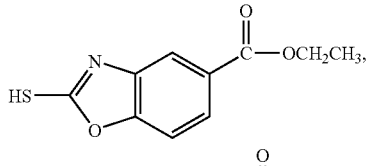

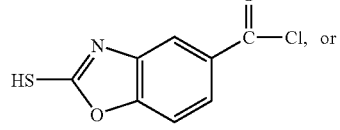

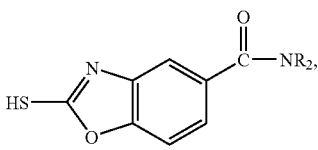

where $R_2$ is an alkyl moiety.

4. The solar cell of claim 1, wherein the bifunctional ligand layer comprises one or more of:

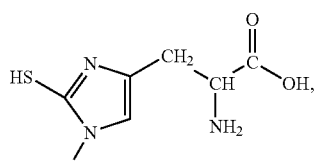

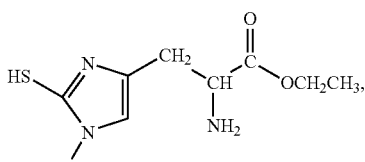

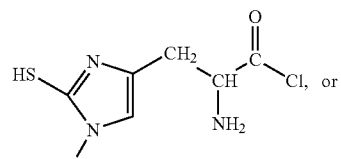

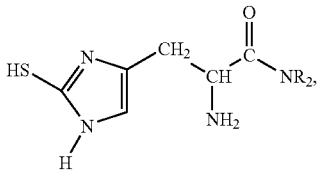

where $R_2$ is an alkyl moiety.

5. A solar cell comprising:
an electron conductor layer;
a quantum dot layer;
a bifunctional ligand layer coupling the electron conductor layer and the quantum dot layer, the bifunctional ligand layer including one or more of:

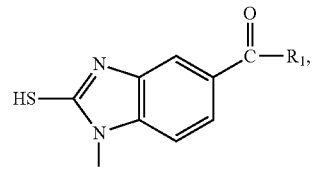

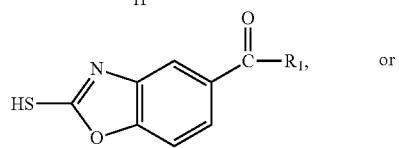

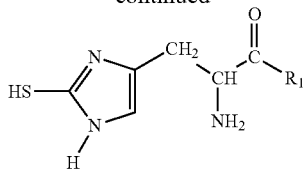
where $R_1$ is hydroxyl, alkoxy, halogen or $NR_2$, with $R_2$ being alkyl;
a hole conductor layer coupled to the quantum dot layer; and
wherein the hole conductor layer comprises
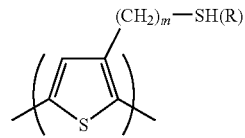
as a repeating unit, where R is absent or alkyl and m is an integer ranging from about 6 to about 12.
* * * * *